SEARCH TUNE SYSTEM FOR TELEVISION RECEIVERS

Original Filed July 30, 1964 3 Sheets-Sheet 1

INVENTOR.
LOUIS F. MAYLE
BY
Lockwood, Woodard, Smith & Weikart
Attorneys

SEARCH TUNE SYSTEM FOR TELEVISION RECEIVERS

Original Filed July 30, 1964 3 Sheets-Sheet 2

INVENTOR.
LOUIS F. MAYLE
BY
Lockwood, Woodard, Smith & Weikart
Attorneys

SEARCH TUNE SYSTEM FOR TELEVISION RECEIVERS

Original Filed July 30, 1964 3 Sheets-Sheet 3

INVENTOR.
LOUIS F. MAYLE

BY
Lockwood, Woodard, Smith & Weikert
Attorneys

United States Patent Office

Re. 27,329
Reissued Apr. 11, 1972

27,329

SEARCH TUNE SYSTEM FOR TELEVISION RECEIVERS

Louis F. Mayle, Fort Wayne, Ind., assignor to The Magnavox Company, Fort Wayne, Ind.

Original No. 3,388,215, dated June 11, 1968, Ser. No. 386,207, July 30, 1964. Application for reissue Apr. 24, 1970, Ser. No. 31,799
Int. Cl. H04n *5/44*
U.S. Cl. 178—5.8 R 35 Claims

Matter enclosed in heavy brackets [ ] appears in the original patent but forms no part of this reissue specification; matter printed in italics indicates the additions made by reissue.

ABSTRACT OF THE DISCLOSURE

An undetented tuner motor holding circuit with an electrically operable normally-closed switch therein. A switch control circuit having a pair of transistors in series therein, both normally non-conducting, one being activated in response to the I-F carrier, and the other being activated in response to a horizontal sync signal, simultaneous activation of both serving to open the motor hold circuit. A third transistor responsive to AGC level for controlling the one transistor in accordance with a sensitivity setting.

Background of the invention

This invention relates generally to search tuning apparatus for radio and television receivers, and more particularly to a search tuning system useful with continuous tuning VHF and UHF television receivers.

In most television receivers presently in use for VHF reception, detent type tuners are employed which have a limited number of rotational positions where television stations may be tuned. The receiver is set up so that where the tuner is motor driven for remote control, it will stop only at the detent positions where a sufficiently strong television signal can be expected. In rotation from one such station to another, inactive or weak channel positions are skipped.

With the advent of wide spread use of UHF for television, wherein the tuners employed are of the continuous rather than the detent type, the desirability of signal seeking or search tuning circuitry is substantial, particularly to enable satisfactory push-button or remote control tuning of such receivers. Even though search tuning circuitry is known for ratio receivers, a particular problem with television receivers is presented by the fact that reversible tuning is desirable and the fact that picture and sound carrier I-F pass through a given frequency at different times during tuning of the recevier. Accordingly, if a search tuning circuit is keyed to respond to a specific I-F frequency, it may respond to either the picture or sound carrier I-F with the result that erratic and frequently inaccurate tuning would occur.

It is therefore a general object of the present invention to provide a search tuning system for a continuous tuning type of television receiver.

A further object is to provide a system enabling the use of a reversible tunder drive and capable of stopping the drive of the tuner accurately from either direction at a station receiving a signal of suitable strength to provide a good picture and sound presentation.

A still further object is to provide a search tuning system wherein adjustment can readily be made by the television user, so that the tuner will stop only on stations providing a presentation suitable to the individual user.

A still further object is to provide a device which will function reliably even where a considerable difference in strength exists between the strongest and the weakest signals to which the system responds.

A still further object is to provide a system achieving the foregoing objects and which is of extremely simple and reliable construction and operation.

A still further object is to provide a device achieving the foregoing objects and which is readily applicable to a wide variety of television receivers.

Described briefly, a typical embodiment of the present invention includes a tunder drive motor which is initially energized by closure of a momentary contact manually or remotely operated switch. A hold circuit is incorporated to maintain operation of the motor after the start switch again opens. However, the hold circuit includes an electrically operated motor stopping switch which is employed to stop the motor when a station of sufficient strength is tuned.

The controller for the motor stopping switch is in series with a pair of transistors, the first of which becomes conductive in response to application thereto of a signal at a predetermined frequency of the I-F picture carrier. The second transistor, which is normally non-conducting, is rendered conducting in response to the application thereto of a signal at some integral multiple of the horizontal synchronizing signal of the television receiver. The integral multiple can be the fundamental frequency (where the integer is 1), or the second harmonic, for example, though other integral multiples may also be used.

Upon coincidence of the sync signal and the predetermined I-F picture carrier frequency, both transistors are conductive and open the motor stopping switch to stop the tuner at the station to which it is then tuned.

Use of the AGC voltage level of the television receiver is made in cooperation with a manually adjustable sensitivity control, to establish the station signal strength which will cause the tuner drive to stop. In other words, the sensitivity of the search tuning circuitry is thereby adjusted.

The full nature of the invention will be understood from the accompanying drawings and the following description and claims.

Figure 1:
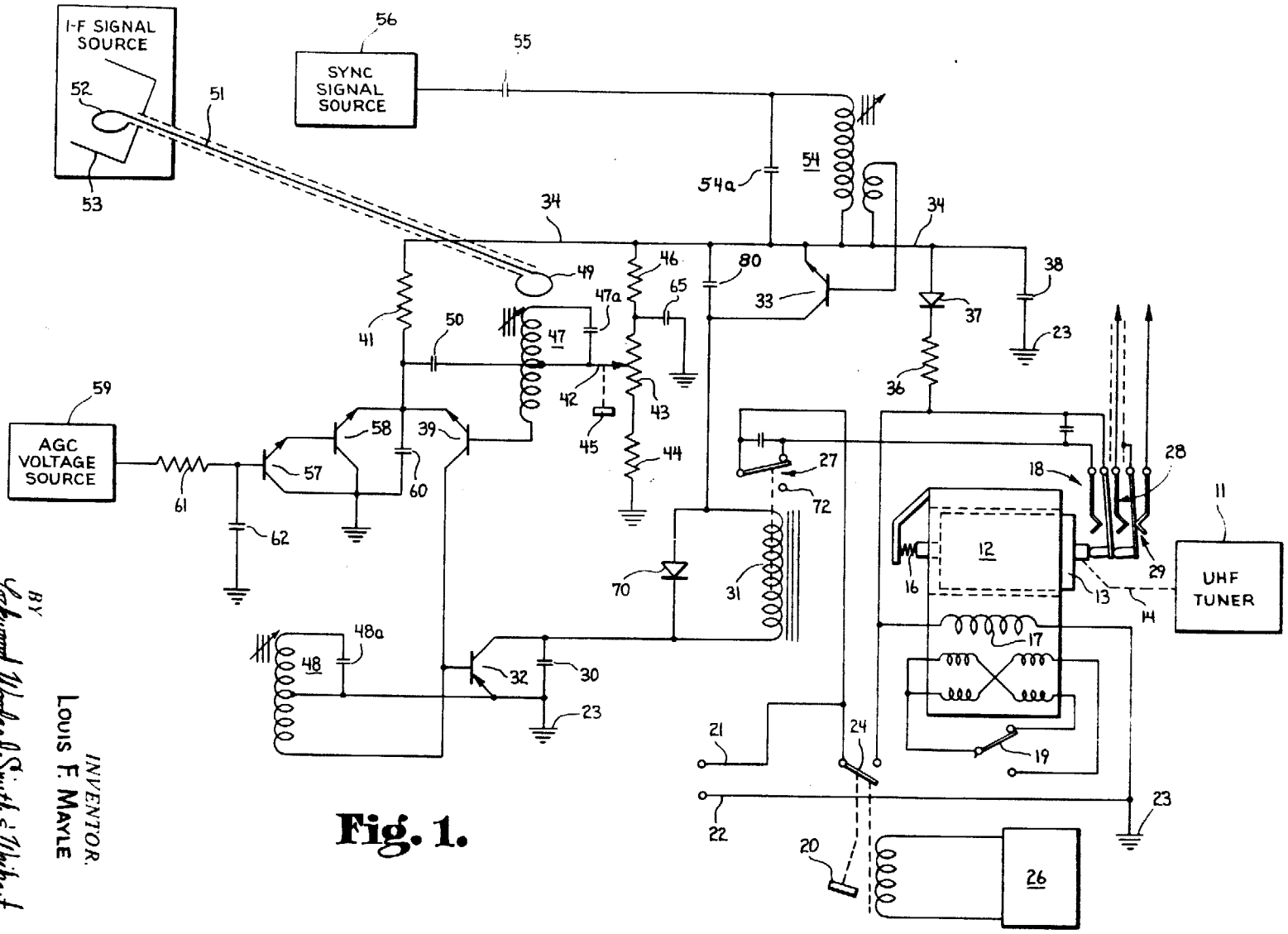
FIG. 1 is a schematic diagram illustrating a typical embodiment of the present invention.

Referring now to the drawings in detail, the television receiver 10 employs a UHF tuner 11 and a tuner drive motor 12, the rotor 13 of the motor being connected to the tuner by suitable means a s indicated schematically by the dotted outline 14, whereby the tuner is driven as the motor rotor rotates.

The drive motor is of the well known offset rotor type wherein the rotor is normally held in an offset condition by a biasing spring 16 when the motor winding 17 is not energized. It thereby normally keeps open the contacts of switch 18 as shown. Suitable windings and a reversing switch 19 are also provided for the motor.

The energy used to drive the motor is normally in the form of 24 volt 60 cycle alternating current electrical energy applied at the terminals 21 and 22, the latter being connected to ground at 23. A motor start switch 24 is connected between terminal 21 and the ungrounded end of motor winding 17. This start switch is a normally-open momentary contact type of switch, and may be manually operated by button 20 if desired, or electrically operated by suitable remote control means 26. This may include, for example, a button operated wired or wireless remote control signal transmitter 25a (FIG. 3) and a remote signal receiver 25b having a relay to operate switch 24. Such apparatus is well known in the art.

Closure of the motor start switch will energize winding 17 and start the motor 12 whereupon the tuner is driven. Of course it also pulls the rotor 13 into alignment with the field and thereupon closes the switch 18. Switch 18 is a part of a motor holding circuit which begins at the terminal 21 continues through the normally closed motor stopping switch 27 and the switch 18 to the ungrounded end of the motor winding 17. Therefore once the motor rotor has pulled in, the motor holding circuit will keep the motor operating so long as the motor stopping switch 27 remains closed and even though the motor start switch is again opened. Additional switch 28 and 29 are also operated by the pull-in of the rotor and these function to squelch both the sound and picture while the tuner is driven.

According to a typical embodiment of the present invention, the motor is stopped at the proper station by the opening of the motor stopping switch 27. This is accomplished by energizing the step relay coil 31 which opens the switch 27.

Control of current through the coil 31 is provided by complementary transistors 32 and 33, the collectors of which are connected to opposite ends of the coil 31. The emitter of transistor 32 is grounded and the emitter of transistor 33 is connected to the conductor 34 which is normally maintained at a direct current potential approximately 20 volts below ground. In order to establish this potential in the illustrated embodiment, a resistor 36 and silicon rectifier 37 are connected in series between the conductor 34 and the ungrounded end of the motor winding 17. Therefore, whenever the winding 17 is energized, a negative direct current potential is provided between ground 23 and the conductor 34, thus providing a D.-C. power supply. A capacitor 38 is provided between ground and the conductor 34 in order to delay the negative rise potential on conductor 34 after closure of the motor start switch 24 until the motor had had time to move the tuner off the station at which it was previously stopped. This enables the system to seek the next station as will be described.

Figure 3:
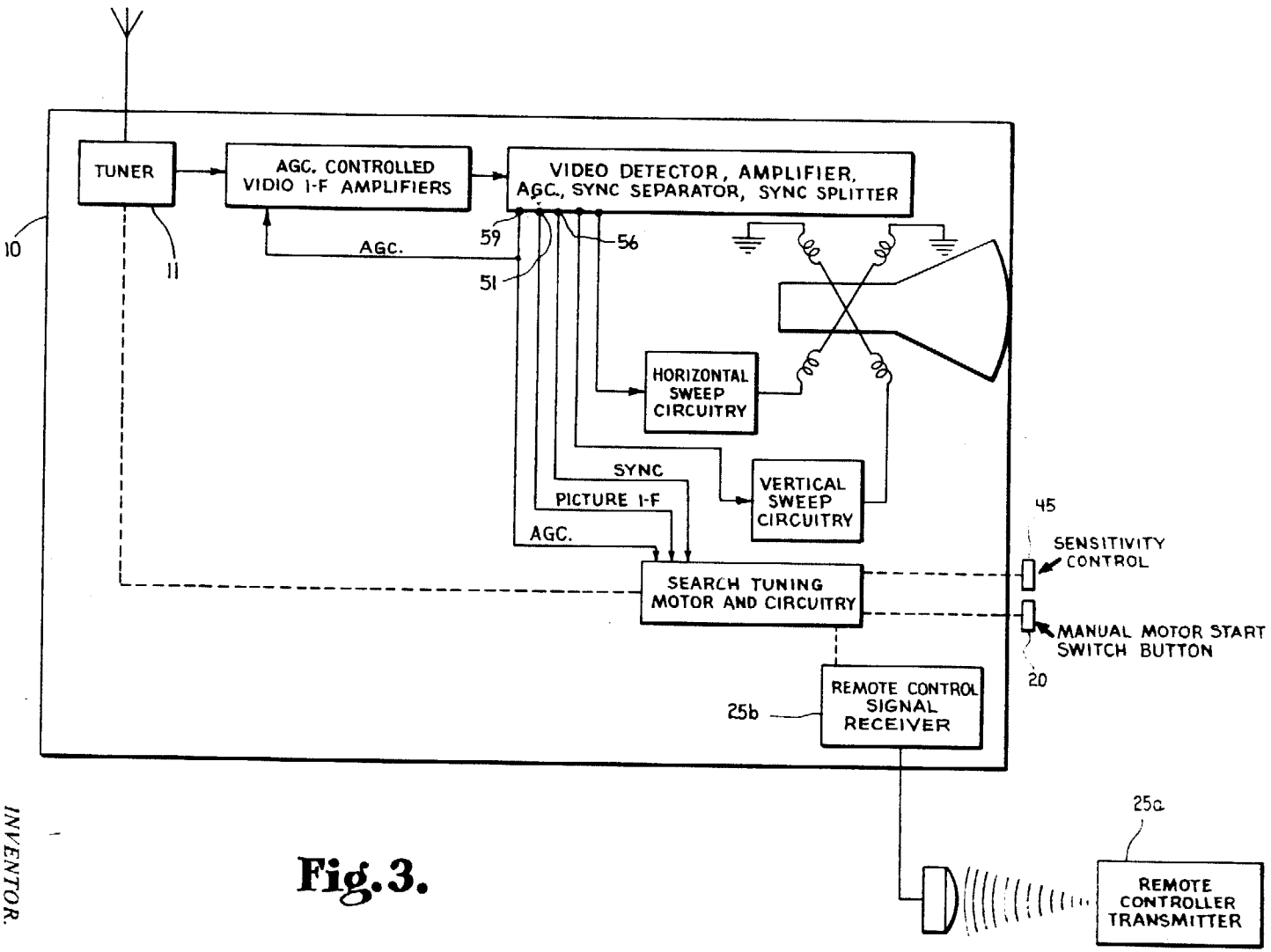
FIG. 3 is a block diagram of a typical television receiver incorporating the present invention.

As indicated in the drawing, a low resistance D.-C. connection is provided between the emitter and base of each of the transistors 32 and 33. Consequently both of these transistors are normally quiescent even though the normal 20 volt potential is present on the conductor 34. Additional control of conduction in transistor 32 is provided by the transistor 39, the collector of which is connected to the base of transistor 32 and the emitter of which is connected through the resistor 41 to the conductor 34. Adjustable bias for transistor 39 is provided by the wiper 42 coupled to the base of transistor 39 and movable between the ends of the resistance 43 which is connected in series with resistances 44 and 46 between ground and the conductor 34. The adjustable arm 42 on resistor 43 providing a potentiometer, is useful as a sensitivity control for the search tuning system. It is connected to knob 45 (FIG. 3).

A high-Q (about 220) tank circuit 47 is coupled to the emitter-base circuit of transistor 39. This tank circuit is resonant at 45.75 mc. A similar tank circuit 48 is coupled to the emitter-base circuit of transistor 32 and is resonant at the same frequency. In effect, the two tank circuits are in cascade, producing a very sharp peak at 45.75 mc. An input signal to the tank circuit 47 is derived by link-coupling to the final video I-F coil of the television receiver. This is indicated schematically by the loop 49 inductively coupled to the coil of the tank circuit 47 and coupled through suitable cable 51 to the loop 52 inside of the video detector coil shield can cover, the pick-up loop 52 being inductively coupled to the video detector coil. Other means of applying the I-F of the television receiver to the tank circuit 47 may also be found satisfactory. Whenever transistor 39 is activated, any 45.75 mc. signal will cause transistor 32 to become conductive. Therefore, in tuning through a television signal, transistor 32 will become conductive whenever the sound carrier passes through 45.75 mc. and whenever the picture carrier passes through 45.75 mc. Without employment of transistor 33 according to the present invention, the searching tuning motor would stop at both of these points, the receiver being grossly mistuned when the sound carrier is at 45.75 mc. This is because in the typical receiver to which the circuit of this example is applied the sync signal is not being received when the sound carrier is at 45.75 mc.

According to the present invention, stopping of the tuner in response to the sound carrier is avoided by the provision of transistor 33 in the stopping switch control circuit. Transistor 33 is an NPN audio type transistor whose emitter-base circuit is coupled to a tank circuit 54 which is resonant at either 15.75 kc. or 31.5 kc. This tank circuit is coupled through a small capacitor (220 pf., for example) to a source 56 of sync pulses in the television receiver. An example of a convenient place to obtain these pulses in the Magnavox Series 40–06 television receiver is the plate of the sync splitter tube. When sync pulses are present, transistor 33 saturates, thereby connecting the upper end of the "stop" relay coil 31 to the power supply bus 34. When transistor 32 conducts while sync pulses are present, coil 31 is energized to open the motor stopping switch. Diode 70 across coil 31 prevents the voltage developed in coil 31 upon current interruption from damaging transistors 32 and 33. A 2 $\mu$f. capacitor 80 connected across the emitter and collector of transistor 33 holds the collector-emitter voltage of the transistor at the saturation level between conduction pulses. Resonating the tank circuit 54 at the second harmonic of the horizontal sync pulses (31.5 kc.) results in a much smaller 60-cycle "notch" at the collector of transistor 33 than occurs when resonating at the fundamental horizontal sync pulse frequency. However, the fundamental may be used if transistor 33 has insufficient gain for use of the second harmonic.

It has been seen that actuation of the stop relay switch to stop the tuner motor will occur only upon coincidence of sync pulses and the desired 45.75 mc. intermediate frequency picture carrier.

Although the high frequency PNP transistor 32 can conduct only when an I-F frequency of 45.75 mc. is present, transistor 39, which is a high frequency NPN transistor, controls conduction through transistor 32 in that it can keep transistor 32 turned off even though an I-F frequency of 45.75 mc. may be present. This is used in providing another feature of the present invention whereby the search tuning is influenced by the television receiver AGC voltage. While there are several ways of doing this according to the present invention, one way in a vacuum tube receiver is by providing a Darlington transistor pair, 57 and 58. These are NPN silicon audio transistors which, in this particular application function as a D-C emitter follower. The emitter of transistor 58 is connected to the emitter of transistor 39, both of which are connected through resistor 41 to the power supply bus 34. The emitter of transistor 57 is connected to the base of transistor 58, and the collectors of both transistors are grounded.

AGC voltage from a source 59 in the television receiver is coupled through resistor 61 to the base of transistor 57. A capacitor 62 is provided to ground so that the time constant of the resistor 61 and capacitor 62 in the base circuit of transistor 57 is the same as the time constant at the point where the AGC voltage is applied to the grids of the controlled I-F stages in the television receiver. This keeps the delay in change of AGC voltage on the search tune circuit the same as on the controlled I-F stages, and filters out the high voltage pulses which may be present in the AGC voltage source.

The AGC voltage source in the television receiver should provide a reverse AGC voltage, i.e. one which increases in a negative direction as the signal received by the television receiver is increasing strength. By adjusting the sensitivity control potentiometer arm 42, the level of AGC voltage which will permit transistor 39 to begin conducting by beginning to cut off transistors 57 and 58, can be established as desired. The sum of the contact potentials of these two silicon transistors 57 and 58 is the minimum collector-emitter voltage of transistor 39 at which transistor 39 can be activated with zero AGC voltage Assume that the sensitivity control is set so that the base of transistor 39 is at some voltage, E. As long as the value of the negative AGC voltage plus the emitter-base contact potentials of transistors 57 and 58 is less than the negative voltage E plus the contact potential of transistor 39, transistor 58 will conduct and transistor 39 will be cut off. When a stronger (more negative) AGC signal is received such that the AGC voltage plus the contact potentials of transistors 57 and 58 has a value equal to the value of E plus the contact potential of transistor 39, transistor 39 will begin to conduct and transistor 58 will begin to cut off. When a still stronger AGC voltage signal is received such that the AGC voltage has a negative value greater than that of voltage E, transistor 58 will be cut off and transistor 39 will be fully activated. Under these conditions, transistor 32 can then conduct when the 45.75 mc. signal is present.

From the foregoing, it can be seen that by adjustment of the wiper arm 42, the search-tune circuitry can be rendered unresponsive to weak distant television stations and also to images of local stations. So functions the sensitivity control knob 45.

Operation

While the foregoing description has suggested the operation of the present invention, a brief review thereof at this point may be helpful. Assume that the television receiver is tuned to a station and receiving a picture and sound at the station. It is desired to change stations and use the signal seeking circuitry of the present invention to stop the tuner at the next station receiving a signal of suitable strength. The sensitivity control is adjusted by the user on the basis of past experience to obtain the desired sensitivity in the searching operation. Then by direct manual actuation or by operation of the remote control means 26, the motor start switch 24 is closed momentarily. This energizes the motor, closing the switch 18 to complete the motor holding circuit which will keep the motor energized until the stop switch 27 is opened. Closure of the start switch 24 and then the hold switch 18 initiates the establishment of a negative potential on the bus 34 to energize the search tune control circuitry. The capacitor 38 delays this rise slightly so that the tuner motor can tune off of the previous station before the circuitry is able to respond to the 45.75 mc. I-F picture carrier of that station. (Capacitor 38 also serves as a filter for the half-wave power supply.)

The tuner motor continues rotating the tuner until a station is reached where the AGC voltage level is such as to cause conduction in transistor 39. Then, when coincidence of the I-F picture carrier signal and the sync signal at that station occur, both transistor 32 and 33 conduct current opening the motor stop switch 27 to de-energize the motor and stop the tuner at that station. At the same time, the D-C supply from the bus 34 is removed by the motor stop switch. It remains removed even though the stop switch may later close, because of the fact that as soon as the motor is de-energized the holding switch 18 is opened.

While the television receiver tuner is searching, both the sound and the picture are squelched. This may easily be done by causing the switch 28 to ground a volume control potentiometer and causing the switch 29 to open a brightness control potentiometer. Such switches may be used in other ways to obtain the same results in various types of receivers.

Figure 2:
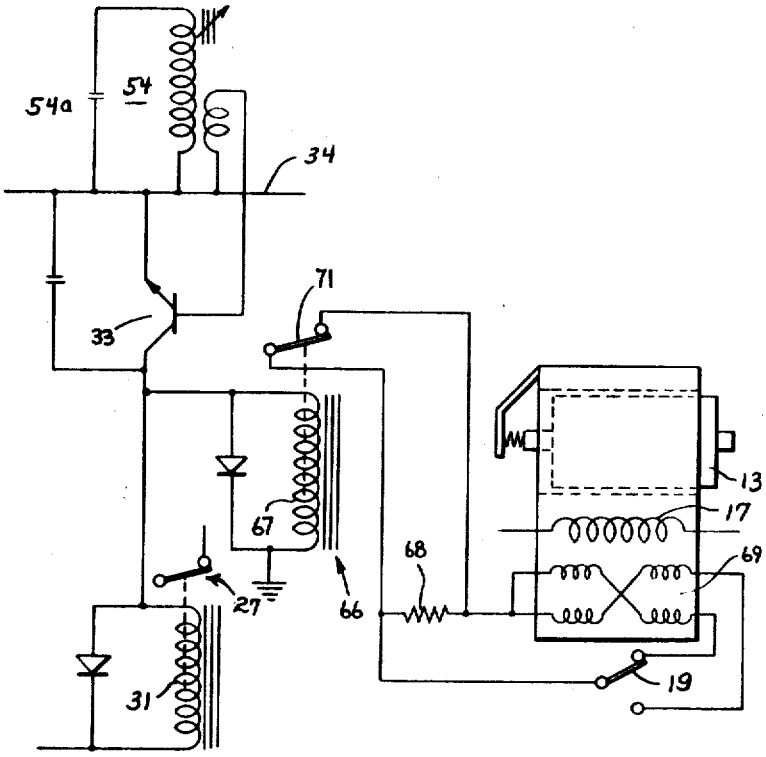
FIG. 2 is a schematic diagram of a variation employed with shaded pole motors.

FIG. 2 is a fragmentary illustration of a portion of the circuit of FIG. 1, and illustrates means of increasing the speed of operation when a reversible shaded-pole motor is used. The tuning shaft speed is increased about 3:1 by changing the pulley ratios between gear box shaft and tuner shaft, or directly coupling the shafts. Such an increase of speed would ordinarily result in the overshooting of the station after de-energization of the motor. To avoid this, relay 66 is provided with the operating coil 67 thereof connected between ground and the collector of transistor 33. A resistor 68 is normally connected in series with the shaded-pole winding 69 of the motor. However, the relay switch 71 normally shorts out the resistor 68.

When the sync signal is received, which occurs shortly before the desired picture I-F signal, current flows through the relay winding 67 and transistor 33 to open the switch 71 which, in effect, adds the resistance 68 in series with the shaded-pole winding. This decreases the speed of the motor so that when the desired I-F frequency is attained, and the motor de-energized, it is operating slow enough that overshoot will not occur.

The embodiment illustrated and described in FIG. 1 is intended for use with tube type television receivers. However, it can readily be employed with transistorized receivers. Where the television receiver I-F amplifier is transistorized transistor 57 may be omitted and transistor 58 could be one of the controlled I-F amplifier transistors.

If desired, the circuit could be used with a tuning indicator lamp to provide very sharp manual tuning indicator. For this purpose, the bottom end of resistor 36 could be connected directly to terminal 21 so that the D-C supply is on at all times when the receiver is on. A 28-volt lamp could be connected between the normally-open contact 72 of the stop relay switch 27 and ground. Then, when manually tuning through a television signal, the stop relay will actuate when the I-F picture carrier passes through 45.75 mc., lighting the lamp, and indicating that the receiver is properly tuned.

The values of various components used in the illustrated embodiment of the present invention are as follows:

| | |
|---|---|
| Transistor **32** | Ge–50 mc.—P2. |
| Transistor **33** | Si-audio. |
| Transistor **39** | Si–50 mc. SE 3001 |
| Transistors **57** and **58** | Si-audio. |
| Capacitors **47a** and **48a** | 18 pf. |
| Capacitor **54a** | .0027 μf. |
| Capacitor **30** | 1500 pf. |
| Capacitor **50** | 2700 pf. |
| Capacitor **60** | 1500 pf. |
| Coil **31** | 2500 ohms. |
| Capacitor **38** | 250 μf. |
| Resistor **36** | 240 ohms. |
| Resistor **41** | 1800 ohms. |
| Resistor **44** | 820 ohms. |
| Resistor **43** | 3000 ohms. |
| Resistor **46** | 8200 ohms. |
| Capacitor **80** | 2 μf. |
| Capacitor **62** | .47 μf. |
| Capacitor **61** | 220,000 ohms. |
| Capacitor **55** | 220 pf. |
| Capacitor **65** | 20 μf. |

While the invention has been disclosed and described in some detail in the drawings and foregoing description, they are to be considered as illustrative and not restrictive in character, as other modifications may readily suggest themselves to persons skilled in this art and within the broad scope of the invention, reference being had to the appended claims.

The invention claimed is:

1. A search-tune system for television receivers, said system comprising:

a reversible tuner drive motor coupled to a detent-free continuous tuner of a television receiver, said motor having a rotor normally biased into an offset position with repsect to a stator, said motor having a winding which, when energized, pulls said rotor into a second position in said stator and drives said rotor to rotate the television tuner;

a motor starting circuit including in series a source of electrical energy, a normally-open starting switch, and said winding;

remote control means coupled to said starting switch for momentary closure thereof from a remote location;

a motor holding circuit including in series said energy source, said winding, a first normally-closed electrically operated motor stopping switch, and a normally-open rotor operated switch;

an operating coil for said motor stopping switch, said coil being operable, when sufficiently energized, to open said stopping switch and thereby de-energize said motor to stop drive of the tuner;

a stopping switch control circuit including in series a source of direct current electrical energy, the emitter-collector path of a first transistor, said operating coil, and the collector-emitter path of a second transistor;

means connected in parallel with the emitter-base paths of both of said transistors, said means having low resistance to direct current, whereby both of said transistors are normally non-conducting;

a control circuit for said first transistor and including in series a source of direct current electrical energy, said normally-open armature switch, the emitter-base path of said first transistor, the collector-emitter-path of a third transistor, and a resistor connected between said source and the emitter of said third transistor;

means normally keeping said third transistor non-conducting, said means including an emitter follower having its emitter connected to the emitter of said third transistor and its collector connected to the voltage source in said control circuit and its base coupled to a reverse AGC voltage source in the television receiver, said emitter follower normally conducting load current when the AGC voltage is less than a predetermined value to keep said third transistor non-conducting;

time constant means coupled to the base of said emitter follower and having a time constant the same as the time constant where the AGC voltage is applied to controlled I-F stages in the television receiver;

biasing means coupled to the base of said third transistor, said biasing means being adjustable to determine the AGC voltage level at which said third transistor will conduct and said emitter follower will cut off, said biasing means thereby serving as a sensitivity control;

a first high-Q tank circuit coupled to the base of said third transistor and resonant at 45.75 mc., said tank circuit being coupled to video I-F circuit means in the television receiver to resonate at 45.75 mc.;

a second high-Q tank circuit coupled to the base of said first transistor and resonant at 45.75 mc., whereby said first transistor is rendered conductive when said third transistor is conducting and an I-F signal in said receiver passes through 45.75 mc.;

a third tank circuit coupled to the base of said second transistor, said third tank circuit being coupled to a source of sync pulses in the television receiver and resonant at an integral multiple of the frequency of the horizontal synchronizing pulses of the television receiver;

said third tank circuit, when resonating, rendering said second transistor conductive whereby, when said first transistor is also conductive, a current flows in said stopping switch control circuit to energize said operating coil and open said stopping switch and de-energize said motor;

the normally-open armature switch thereupon breaking the control circuit for said first transistor;

and time delay means coupled to said direct current energy source and operable when said starting switch is closed, to delay the rise of direct current voltage supply to said third transistor until said motor has moved the tuner out of tune with the station at which it was tuned when the motor was de-energized.

2. The circuit as set forth in claim 1 wherein said motor is a shaded pole motor, said circuit further comprising:

a resistance in series with the shaded pole winding of the motor;

a second normally closed eletcrically operated switch in shunt with said resistance;

and an operating circuit for said second switch and including said second transistor in series whereby said second switch is opened when said second transistor is conductive, to reduce speed of said motor.

3. A search-tune system for television receivers, said system comprising:

a tuner drive motor coupled to the tuner of a television receiver to drive the television tuner;

a motor starting circuit including in series a source of electrical energy, a normally-open starting switch, and said motor;

a motor holding circuit including in series said energy source, said motor, and a first normally-closed electrically operated motor stopping switch;

an operating coil for said motor stopping switch, said coil being operable, when sufficiently energized, to open said stopping switch and de-energize said motor to stop drive of the tuner;

a stopping switch control circuit including in series a source of direct current electrical energy, the emitter-collector path of a first transistor, said operating coil, and the collector-emitter path of a second transistor;

means connected to the emitter-base paths of both of said transistors whereby both of said transistors are normally non-conducting;

a control circuit for said first transistor and including in series a source of direct current electrical energy, the emitter-base path of said first transistor, the collector-emitter path of a third transistor, and a resistor connected between said source and the emitter of said third transistor;

means normally keeping said third transistor non-conducting, said means including an emitter follower having its emitter connected to the emitter of said third transistor and its collector connected to the voltage source in said control circuit and its base coupled to a reverse AGC voltage source in the television receiver, said emitter follower normally conducting load current when the AGC voltage is less than a predetermined value to keep said third transistor non-conducting;

biasing means coupled to the base of said third transistor, said biasing means being adjustable to determine the AGC voltage level at which said third transistor will conduct and said emitter follower will cut off, said biasing means thereby serving as a sensitivity control;

a first high-Q tank circuit coupled to the base of said third transistor and resonant at a predetermined picture carrier intermediate frequency of the television receiver, said tank circuit being coupled to video I-F circuit means in the television receiver to resonate at said predetermined frequency;

a second high-Q tank circuit coupled to the base of said first transistor and resonant at said predetermined frequency whereby said first transistor is conducting and a signal carrier in said receiver passes through said predetermined frequency;

a third tank circuit coupled to the base of said second transistor, said third tank circuit being coupled to the synchronizing circuitry of the television receiver and resonant at an integral multiple of the frequency of synchronizing signals in the television receiver;

said third tank circuit, when resonating, rendering said second transistor conductive whereby, when said first transistor is also conductive, a current flows in said stopping switch control circuit to energize said operating coil and open said stopping switch and de-energize said motor.

4. A search-tune system for television receivers, said system comprising:

a tuner drive motor coupled to the tuner of a television receiver to drive the television tuner;

a motor starting circuit including in series a source of electrical energy, a normally-open starting switch, and said motor;

a motor holding circuit including in series said energy source, said motor, and a first normally-closed electically operated motor stopping switch;

an operator for said motor stopping switch, said operator being operable, when sufficiently energized, to open said stopping switch for de-energizing said motor to stop drive of the tuner;

a stopping switch control circuit including in series a source of electrical energy, the load circuit path of a first transistor, said operator, and the load circuit path of a second transistor, both of said transistors being normally non-conducting;

a control circuit for said first transistor and including the load circuit path of a third transistor coupled to a control electrode of said first transistor;

control means normally keeping said third transistor non-conducting, said control means including emitter follower means coupled to said third transistor, and a source of AGC voltage in the television receiver, said emitter follower means normally conducting load current when the AGC voltage is less than a predetermined value to keep said third transistor non-conducting;

biasing means coupled to the base of said third transistor, said biasing means being adjustable to determine the AGC voltage level at which said third transistor will conduct and said emitter follower will cut off, said biasing means thereby serving as a sensitivity control;

a first tank circuit coupled to said third transistor and resonant at a predetermined picture carrier intermediate frequency of the television receiver, said tank circuit being coupled to I-F circuit means in the television receiver to resonate at said predetermined frequency;

a second tank circuit coupled to said first transistor and resonant at said predetermined frequency whereby said first transistor is rendered conductive when said third transistor is conducting and a signal carrier in said receiver passes through said predetermined frequency;

a third tank circuit coupled to said second transistor, said third tank circuit being coupled to the synchronizing circuitry of the television receiver and resonant at an integral multiple of the frequency of synchronizing signals in the television receiver;

said third tank circuit, when resonating, rendering said second transistor conductive whereby, when said first transistor is also conductive, a current flows in said stopping switch control circuit to energize said operator and open said stopping switch for de-energizing said motor.

5. A search-tune system for television receivers, said system comprising:

a tuner drive motor coupled to the tuner of a television receiver to drive the television tuner;

a motor starting circuit including in series a source of electrical energy, a normally-open starting switch, and said motor;

a motor holding circuit including in series said energy source, said motor, and a first normally-closed electrically operated motor stopping switch;

an operator for said motor stopping switch, said operator being operable, when sufficiently energized, to open said stopping switch for de-energizing said motor to stop drive of the tuner;

a stopping switch control circuit including in series a source of electrical energy, a load circuit path of a first signal translating device, said operator, and a load circuit path of a second signal translating device, both of said signal translating devices being normally inactive;

a control circuit for said first device and including a load circuit path of a third signal translating device coupled to a control electrode of said first device;

control means coupled to said third device and to a source of AGC voltage in the television receiver, said control means normally keeping said third device inactive when the AGC voltage is less than a predetermined value;

adjustable means coupled to said third device to determine the AGC voltage level at which said third device will become active, said adjustable means thereby serving as a sensitivity control;

first resonant circuit means coupled to said third device and resonant at a predetermined picture carrier intermediate frequency of the television receiver, said resonant circuit means being coupled to I-F circuit means in the television receiver to resonate at said predetermined frequency;

second resonant circuit means coupled to said first device and resonant at said predetermined frequency whereby said first device is rendered active when said third device is active and a signal carrier in said receiver passes through said predetermined frequency;

third resonant circuit means coupled to said second device, said third circuit means being coupled to the synchronizing circuitry of the television receiver and resonant at an integral multiple of the frequency of synchronizing signals in the television receiver;

said third resonant circuit means, when resonating, rendering said second device active whereby, when said first device is also active, a current in said stopping switch control circuit energizes said operator to open said stopping switch for de-energizing said motor.

6. In a search-tune system for a radio frequency signal receiver, the combination comprising:

a drive motor for driving a tuner of the receiver;

a motor starting circuit including in series a source of electrical energy, a normally-open starting switch, and said motor;

a motor holding circuit including in series said energy source, said motor, and a first normally-closed electrically operated motor stopping switch;

an operator for said motor stopping switch, said operator being operable, when sufficiently energized, to open said stopping switch for de-energizing said motor to stop drive of the tuner;

a stopping switch control circuit including in series a source of electrical energy, a load circuit path of a first signal translating device, said operator, and a load circuit path of a second signal translating device, both of said signal translating devices being normally inactive;

control means for said first device and including first input means for an AGC voltage from the receiver, said input means being coupled to a control electrode of a third signal translating device having a load circuit path coupled to a control electrode of said first device, to enable AGC voltage level to control conduction in said first device;

adjustable sensitivity control means coupled to said third signal translating device to limit the degree of control by AGC voltage;

input means for an intermediate frequency signal carrier from the receiver;

first resonant circuit means coupled to said third device and resonant at a predetermined picture carrier intermediate frequency of the television receiver, said resonant circuit means being coupled to said intermediate frequency signal input means to resonate at said predetermined frequency;

second resonant circuit means coupled to said first device and resonant at said predetermined frequency, whereby said first device is rendered active when said third device is active and a signal carrier at said intermediate frequency input means passes through said predetermined frequency;

input means for a synchronizing signal from the receiver;

third resonant circuit means coupled to said synchronizing signal input means and to said second translating device, said third resonant means being resonant at an integral multiple of the frequency of synchronizing signals received at said input means therefor;

said third resonant means, when resonating, rendering said second device active whereby, when said first device is also active, a current in said stopping switch control circuit energizes said operator to open said stopping switch for de-energizing said motor.

7. In a search-tune system for a radio frequency signal receiver, the combination comprising:

a drive motor for driving a tuner of the receiver;

a motor starting circuit including in series a source of electrical energy, a normally-open starting switch, and said motor;

a motor holding circuit including in series said energy source, said motor, and a first normally-closed electrically operated motor stopping switch;

an operator for said motor stopping switch, said operator being operable when sufficiently energized, to open said stopping switch for de-energizing said motor to stop drive of the tuner;

a stopping switch control circuit including in series a source of electrical energy, a load circuit path of a first signal translating device, said operator, and a load circuit path of a second signal translating device, both of said signal translating devices being normally inactive;

a control circuit for said first device and including a load circuit path of a third signal translating device coupled to a control electrode of said first device;

and first input means for an AGC voltage from the receiver, said input means being coupled to said third signal translating device to enable AGC voltage level to control conduction in said first device.

8. In a search-tune system for a radio frequency signal receiver, the combination comprising:

a drive motor for driving a tuner of the receiver;

a motor starting circuit including a source of electrical energy, a normally-open starting switch, and said motor;

a motor holding circuit including said energy source, said motor, and a first normally-closed electrically operated motor stopping switch;

an operator for said motor stopping switch, said operator being operable, when sufficiently energized, to open said stopping switch for de-energizing said motor to stop drive of the tuner;

a stopping switch control circuit including in series a source of electrical energy, a load circuit path of a first signal translating device, said operator, and a load circuit path of a second signal translating device, both of said signal translating devices being normally inactive;

input means for an intermediate frequency signal carrier from the receiver;

first resonant means coupled to said intermediate frequency signal carrier input means and to said first device and resonating at a predetermined intermediate frequency to activate said first device;

input means for a synchronizing signal from said receiver:

second resonant means coupled to said synchronizing signal input means and to said second translating device and resonant at the frequency of the synchronizing signal from the receiver to activate said second translating device whereby both of said translating devices are rendered active upon coincidence of an intermediate frequency signal of said predetermined frequency and said synchronizing signal in the receiver for accommodating current flow in said stopping switch control circuit to energize said operator for opening said stopping switch for de-energizing said motor.

9. A search-tune system for television receivers, said system comprising:

a tuner drive motor coupled to the tuner of a television receiver, said motor, when energized, driving said television tuner;

a motor starting circuit including in series a source of electrical energy, a normally-open starting switch, and said motor;

a motor holding circuit including in series said energy source, said motor, and a first normally-closed electrically operated motor stopping switch;

operating means for said motor stopping switch, said operating means being operable, when energized, to open said stopping switch for de-energizing said motor to stop drive of the tuner;

a stopping switch control circuit including in series a source of electrical energy, a load circuit path of a first transistor, said operating means, and a load circuit path of a second transistor, both of said transistors being normally non-conducting;

first control means for said first transistor and coupled to a carrier signal of said receiver, said control means being resonant at a first predetermined frequency to thereupon enable conduction through said first transistor;

and second control means for said second transistor and coupled to synchronizing circuitry of said receiver, said second control means being resonant at a second predetermined signal frequency to enable conduction through said second transistor, the simultaneous conduction through both of said transistors enabling establishment of current in said stopping switch control circuit and thereby energizing said operating means for de-energizing said motor and stopping the drive of said tuner, the stopping of said motor by said operating means requiring simultaneous conduction through both of said transistors and, therefore, requiring coincidence, in the receiver, of a carrier signal of said first predetermined frequency, and a signal of said second predetermined frequency in said second control means.

10. The system as set forth in claim 9 wherein said second control means are resonant at an integral multiple of a synchronizing signal frequency in said receiver, and said first predetermined frequency to which said first control means are resonant is a picture signal carrier intermediate frequency occurring during the presence of the synchronizing signal in said receiver.

11. The system as set forth in claim 9 and further comprising:

input means for an AGC signal from said receiver, said input means being coupled to one of said control means to prevent simultaneous conduction through both of said transistors in the absence of reception by the receiver of signals of a predetermined minimum strength.

12. The system as set forth in claim 9 wherein said motor is a shaded pole motor having a shaded pole winding, said system further comprising:

a resistance connected in series with the shaded pole winding of said motor;

a second normally-closed electrically operated switch connected in shunt with said series resistance;

operating means for said second switch, said operating means being operable when energized to open said switch to place said resistance in series with said shaded pole winding to reduce the speed of said motor;

and a control circuit for said second normally-closed switch and including said operating means, a source of electrical energy, and said second transistor, whereby, when said second transistor is activated, current flows in said operating means for said second switch to open said switch and place said resistance in series with said motor winding to reduce the speed of said motor.

13. In a search-tune system for a radio frequency signal receiver, the combination comprising:

motor means for driving a tuner;

motor control means coupled to said motor means and including load circuit paths of first and second signal translating devices in a motor control circuit;

means normally maintaining said first and second translating devices inactive;

first input means for receiving a signal carrier from the receiver and coupled to said first translating device and resonant at a first predetermined frequency of said carrier to activate said first device;

second input means for a synchronizing signal from said receiver and coupled to said second translating device and resonant at a second predetermined frequency to activate said second translating device;

whereby coincidence of signals in the receiver at said predetermined frequencies activates both of said translating devices and thereby said motor control means to control the tuner drive for the receiver.

14. The system as set forth in claim 13 and further comprising:

input means for an AGC signal from the receiver and coupled to one of said translating devices to maintain said translating device inactive regardless of the coincidence of signals of said predetermined frequencies when the AGC signal is of less than a predetermined minimum strength.

15. The system as set forth in claim 13 wherein:

said load circuit paths are connected in series with each other and with a motor control switch operator for said motor means.

*16. Circuitry for the automatic tuning of a television receiver having tuner drive means with switching means coupled thereto for control of said tuner drive means, said circuitry comprising:*

*first input means for connection to a source of alternating current electrical energy;*

*first transistor means having a control circuit path and a load circuit path;*

*a switch operator for said switching means, a first rectifier, first resistance means, and the load circuit path of said first transistor means, connected in series circuit relation across said first input means;*

*second input means receiving a signal produced in a television receiver in response to the tuning of the receiver to and reception thereby of signals produced by a television transmitter;*

*means coupling said second input means with said transistor control circuit path to respond to said produced signal to thereby effect in said transistor control circuit path a current sufficient to cause current in said transistor load circuit path to sufficiently energize said switch operator to operate said switching means for deactivating said tuner drive means.*

*17. In a search-tune system for a radio-frequency signal receiver having tuner drive means with switching means coupled thereto for control of said tuner drive means, the combination comprising:*

*first input means for a supply of energy;*

*first signal translating means having a control circuit path and load circuit path;*

*switch operating means for said switching means, and the load circuit path of said first signal translating means being coupled to said first input means;*

*second input means receiving signal produced in a radio frequency receiver in response to the tuning of the receiver to and reception thereby of signals produced by a transmitter;*

*means coupling said second input means with said control circuit path to respond to said produced signals to thereby admit current through said load circuit path in an amount sufficient to activate said switch operating means to operate said switching means for deactivating said tuner drive means;*

*said means coupling second input means with said control circuit path including transformer means having primary circuit means coupled to said second input means and secondary circuit means in circuit with said control circuit path;*

*said circuitry further comprising a first tank circuit including first capacitance means and said primary circuit means connected in tank circuit relationship, said first tank circuit being tuned to resonate in response to said produced signals when they are of a predetermined frequency to thereupon induce in said secondary circuit means and thereby in said control circuit path current pulses sufficient to enable the current in said load circuit path reach said sufficient amount.*

*18. The circuitry of claim 17 and further comprising: second capacitance means connected across the said load circuit path of said first signal translating means to maintain a saturation condition in said signal translating means between current pulses in said control circuit path thereof.*

*19. The circuitry of claim 18 wherein:*

*said operating means include a relay coil,*

*the capacitance of said second capacitance means being sufficient to prevent sudden interruption of current in said relay coil thereby avoiding kickback pulses detrimental to said signal translating means.*

*20. The circuitry of claim 17 wherein: said second input means includes the synchronizing signal source in a television receiver.*

*21. In a television tuning arrangement; a tuner movable sequentially into a plurality of positions corresponding to broadcast channels, a drive motor connected to the tuner, means for initiating a supply of energy to said motor, a holding circuit connected to said motor to maintain the supply of energy to the motor, and control means for interrupting the supply of energy to said motor to halt the motor when the tuner is moved into a said position wherein a broadcast signal is being received, said holding circuit including normally- closed switch means operable, when opened, to disable said holding circuit from continuing to maintain said supply of energy to the motor, and said control means being connected to said holding circuit in controlling relation thereto and comprising signal translating means connected to be sensitive to synchronizing signals received on a broadcast signal tuned in by said tuner to open said switch means.*

*22. The television tuning arrangement of claim 21 wherein said holding circuit is responsive to operation of said motor.*

*23. The combination of claim 21 wherein:*

*said switch means are electrically operable;*

*said signal translating means normally conducting insufficient current to operate said switch means, but*

*responsive to signals received on a broadcast signal tuned in by said tuner to conduct current sufficient to open said switch means.*

*24. In a search-tune system for a radio-frequency signal receiver, the combination comprising:*

*a tuner having tuner drive means;*

*means for initiating a supply of energy to said tuner drive means;*

*a holding circuit coupled to said tuner drive means to maintain the supply of energy to said drive means, said holding circuit including switch means;*

*control means coupled to said switch means and including signal translating means;*

*said initiating means and said holding circuit being coupled to said control means for initiating and maintaining a supply of energy to said control means to enable operation of said control means until opening of said switch means;*

*said signal translating means being rendered sufficiently conducting in response to signals received on a broadcast signal tuned in by said tuner, to open said switch means.*

*25. The combination of claim 24 and further comprising: delay means coupled to said control means to delay enablement of said control means by said initiating means.*

*26. In a search-tune system for a radio frequency signal receiver, the combination comprising:*

*motor means for driving a tuner;*

*motor control means coupled to said motor means and including load circuit paths of first and second signal translating devices in series in a motor control circuit;*

*means normally maintaining said first and second translating devices in one condition;*

*first input means for receiving a first signal from the receiver and coupled to said first translating device and responsive to said first signal to change the condition of said first device;*

*second input means for a second signal from said receiver and coupled to said second translating device and responsive to said second signal to change the condition of said second translating device;*

*whereby coincidence of said first and second signals in the receiver change the condition of both of said translating devices and thereby cause said motor control means to control the tuner drive for the receiver.*

*27. In a search-tune system for a radio frequency signal receiver, the combination comprising:*

*motor means for driving a tuner;*

*motor control means coupled to said motor means and including load circuit paths of first and second signal translating devices in a motor control circuit;*

*means normally maintaining said first and second translating devices inactive;*

*first input means for receiving a signal carrier from the receiver and coupled to said first translating device and responsive to a first predetermined frequency of said carrier to activate said first device;*

*second input means for a synchronizing signal from said receiver and coupled to said second translating device and responsive to said synchronizing signal to activate said second translating device,*

*whereby coincidence of said synchronizing signal and a carrier signal of said first predetermined frequency activates both of said translating devices and thereby said motor control means to control the tuner drive for the receiver.*

*28. The combination of claim 27 wherein: said first input means are resonant at said first frequency to activate said first device.*

*29. In a search-tune system for a radio frequency signal receiver, the combination comprising:*

*motor means for driving a tuner;*

*a motor starting circuit including said motor means and a first switch;*

*a motor holding circuit including said motor means and a second switch;*

*motor control means coupled to said motor means and including load circuit paths of first and second signal translating devices, and including control means for said second switch coupled to said load circuit paths for control of said switch control means by said signal translating devices;*

*means normally maintaining said first and second translating devices in one condition during tuner drive by said motor means;*

*first input means for receiving a first signal from the receiver and coupled to said first translating device and responsive to said first signal to change the condition of said first device;*

*second input means for a second signal from said receiver and coupled to said second translating device and responsive to said second signal to change the condition of said second translating device;*

*whereby coincidence of said first and second signals in the receiver change the condition of both of said translating devices and thereby cause said switch control means to change the condition of said second switch and thereby terminate the tuner drive for the receiver.*

*30. In a search-tune system for a radio frequency signal receiver, the combination comprising:*

*motor means for driving a tuner;*

*a motor starting circuit and motor holding circuit including said motor means;*

*motor control means coupled to said motor means and including load circuit paths of first and second signal translating devices;*

*first input means for receiving a signal carrier from the receiver and coupled to said first translating device for changing the state of said first device in response to a predetermined carrier frequency;*

*second input means for a synchronizing signal from said receiver and coupled to said second translating device for change of state of said second device in response to said synchronizing signal,*

*said motor control means further including a motor hold circuit switch and switching means, said switching means being rendered non-conducting by concurrent change of state of said first and second translating devices to open said motor hold circuit to control tuner drive for the receiver.*

*31. In a search-tune system for a radio frequency signal receiver, the combination comprising:*

*motor means for driving a tuner;*

*a motor hold switch;*

*motor control means coupled to said motor means and including first, second, and third switching means;*

*first input means for receiving a signal carrier from the receiver and coupled to said first switching means for changing the state of said first switching means in response to a predetermined carrier frequency,*

*second input means for a synchronizing signal from said receiver and coupled to said second switching means to enable change of state of said second switching means in response to said synchronizing signal,*

*said third switching means being rendered non-conducting by concurrent change of state of said first and second switching means, to open said motor hold switch.*

*32. The combination of claim 31 and further comprising:*

*a start switch in a motor starting circuit,*

*said hold switch being closed electrically in response to closure of said start switch.*

*33. The combination of claim 32, wherein said motor starting circuit includes said motor means.*

*34. The combination of claim 33, wherein said hold switch is a normally-open switch in a holding circuit including said motor means.*

*35. The combination of claim 34, wherein said holding circuit further includes a normally-closed switch.*

References Cited

The following references, cited by the Examiner, are of record in the patented file of this patent or the original patent.

UNITED STATES PATENTS

| | | | |
|---|---|---|---|
| 2,890,274 | 6/1959 | Guyton | 178—5.8 |
| 2,898,400 | 8/1959 | Parmet et al. | 178—5.8 |
| 2,910,530 | 10/1959 | Clark | 178—5.8 |
| 3,011,017 | 11/1961 | Oeler et al. | 178—5.8 |
| 3,045,060 | 7/1962 | Meyer | 178—5.8 |
| 3,130,264 | 4/1964 | Dietz | 178—5.8 |
| 3,131,255 | 4/1964 | Di Nardo | 178—5.8 |

ROBERT L. RICHARDSON, Primary Examiner

U.S. Cl. X.R.

178—5.8 AF; 325—464, 471; 334—20